(12) United States Patent
Burggraf et al.

(10) Patent No.: US 9,245,869 B2
(45) Date of Patent: Jan. 26, 2016

(54) METHOD FOR FASTENING CHIPS WITH A CONTACT ELEMENT ONTO A SUBSTRATE PROVIDED WITH A FUNCTIONAL LAYER HAVING OPENINGS FOR THE CHIP CONTACT ELEMENTS

(71) Applicant: EV GROUP E. THALLNER GMBH, St. Florian am Inn (AT)

(72) Inventors: Jurgen Burggraf, Scharding (AT); Markus Wimplinger, Ried im Innkreis (AT); Harald Wiesbauer, Altheim (AT); Alfred Sigl, Ottmaring (DE)

(73) Assignee: EV Group E. Thallner GmbH, St. Florian (AT)

( * ) Notice: Subject to any disclaimer, the term of this patent is extended or adjusted under 35 U.S.C. 154(b) by 0 days.

(21) Appl. No.: 14/395,084

(22) PCT Filed: Mar. 18, 2013

(86) PCT No.: PCT/EP2013/055556
§ 371 (c)(1),
(2) Date: Oct. 17, 2014

(87) PCT Pub. No.: WO2013/156234
PCT Pub. Date: Oct. 24, 2013

(65) Prior Publication Data
US 2015/0104902 A1    Apr. 16, 2015

(30) Foreign Application Priority Data

Apr. 19, 2012    (DE) .......................... 10 2012 103 430

(51) Int. Cl.
*H01L 21/00* (2006.01)
*H01L 23/00* (2006.01)
(Continued)

(52) U.S. Cl.
CPC .............. *H01L 24/97* (2013.01); *H01L 21/563* (2013.01); *H01L 24/27* (2013.01); *H01L 24/29* (2013.01); *H01L 24/73* (2013.01); *H01L 24/81* (2013.01); *H01L 24/83* (2013.01); *H01L 24/92* (2013.01); *H01L 24/13* (2013.01); *H01L 25/0655* (2013.01);
(Continued)

(58) Field of Classification Search
CPC ............................................. H01L 2224/83192
See application file for complete search history.

(56) References Cited

U.S. PATENT DOCUMENTS 4,818,728 A * 4/1989 Rai et al. ........................ 438/108
5,384,952 A * 1/1995 Matsui ............................ 29/840
(Continued)

FOREIGN PATENT DOCUMENTS

| DE | 196 51 566 | 6/1998 | ............. H01L 21/58 |
| DE | 10 2006 045 094 | 3/2008 | ............. H01L 21/60 |
| WO | WO 2004/077527 | 9/2004 | |

OTHER PUBLICATIONS

International Search Report for International Application No. PCT/EP2013/055556, Aug. 21, 2013.

*Primary Examiner* — Angel Roman
(74) *Attorney, Agent, or Firm* — Kusner & Jaffe

(57) ABSTRACT

A method for tacking of chips onto a substrate at chip positions which are distributed on a surface of the substrate. The method includes the following steps: formation or application of a function layer onto the substrate, removing the function layer from the substrate at the chip positions at least in the region of contacts to uncover the contacts, tacking chips onto one chip contact side of the function layer at the chip positions and contacting the chips with the contacts via contact elements.

21 Claims, 4 Drawing Sheets

Figure 1A:
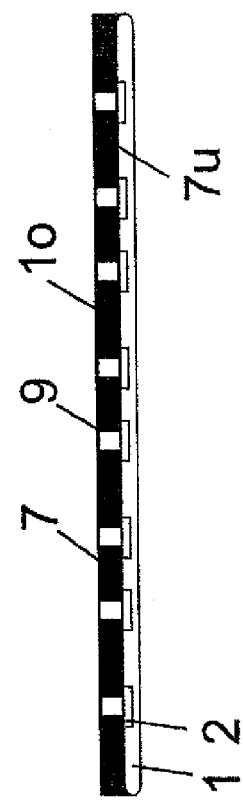

(51) Int. Cl.
  *H01L 21/56* (2006.01)
  *H01L 25/065* (2006.01)
  *H01L 25/00* (2006.01)

(52) U.S. Cl.
  CPC ........... *H01L 25/50* (2013.01); *H01L 2224/131* (2013.01); *H01L 2224/13013* (2013.01); *H01L 2224/13014* (2013.01); *H01L 2224/2741* (2013.01); *H01L 2224/27416* (2013.01); *H01L 2224/27418* (2013.01); *H01L 2224/27436* (2013.01); *H01L 2224/27444* (2013.01); *H01L 2224/27515* (2013.01); *H01L 2224/27622* (2013.01); *H01L 2224/29011* (2013.01); *H01L 2224/29012* (2013.01); *H01L 2224/2919* (2013.01); *H01L 2224/73104* (2013.01); *H01L 2224/73153* (2013.01); *H01L 2224/73204* (2013.01); *H01L 2224/8114* (2013.01); *H01L 2224/81191* (2013.01); *H01L 2224/81192* (2013.01); *H01L 2224/81193* (2013.01); *H01L 2224/81203* (2013.01); *H01L 2224/81815* (2013.01); *H01L 2224/81907* (2013.01); *H01L 2224/83002* (2013.01); *H01L 2224/83009* (2013.01); *H01L 2224/83102* (2013.01); *H01L 2224/83192* (2013.01); *H01L 2224/83193* (2013.01); *H01L 2224/83203* (2013.01); *H01L 2224/83856* (2013.01); *H01L 2224/83907* (2013.01); *H01L 2224/9205* (2013.01); *H01L 2224/9211* (2013.01); *H01L 2224/97* (2013.01); *H01L 2924/181* (2013.01); *H01L 2924/381* (2013.01)

(56) References Cited

U.S. PATENT DOCUMENTS

| | | | | |
|---|---|---|---|---|
| 5,611,140 | A * | 3/1997 | Kulesza et al. | 29/832 |
| 6,168,972 | B1 | 1/2001 | Wang et al. | 438/108 |
| 2004/0169275 | A1* | 9/2004 | Danvir et al. | 257/737 |
| 2005/0266670 | A1* | 12/2005 | Lin et al. | 438/613 |
| 2006/0068521 | A1* | 3/2006 | Shi et al. | 438/108 |
| 2008/0268570 | A1* | 10/2008 | Shen et al. | 438/107 |
| 2012/0199981 | A1* | 8/2012 | Jeong et al. | 257/774 |

* cited by examiner

METHOD FOR FASTENING CHIPS WITH A CONTACT ELEMENT ONTO A SUBSTRATE PROVIDED WITH A FUNCTIONAL LAYER HAVING OPENINGS FOR THE CHIP CONTACT ELEMENTS

FIELD OF THE INVENTION

This invention relates to a method for tacking of chips onto a substrate at chip positions which are distributed on a surface of the substrate.

BACKGROUND OF THE INVENTION

Chips are often joined via bumps to bond pads embedded in a substrate, therefore electrically conductive contacts. To bridge the distance between the chips and the substrate and to produce a mechanical connection between the chip and the substrate, underfill materials are used which are also employed for mechanical relief of the bumps from the chip or substrate. The underfill material increases the service life of the chips several-fold. Mainly the fatigue strength of the bond connection at complete stress reversal with respect to temperature changes and/or mechanical loads is increased.

In practice an underfill material with low viscosity is placed between the chips and the substrate by capillary action after the underfill material has been applied for example by inkjet methods or centrifugal acceleration methods. The aforementioned methods limit the choice of materials, and at short distances between the chips and the substrate surface, for example less than 50 μm, the aforementioned sequence is very time-consuming or can no longer be implemented.

One alternative method therefore consists in applying the underfill material before applying the chips to the substrate, especially at very small distances between the chips and the substrate surface. The underfill material is laminated for example as a film onto the substrate, applied by spin coating or spray coating or is distributed on the substrate by application of pasty material.

So that the chips which have been seated on the underfill material do not slip on the substrate up to the bonding which is generally carried out in a separate chamber, the chips are fixed beforehand in their respective chip position which is aligned with the substrate, especially by "tacking". This has the advantage that the entire substrate can be provided with chips and only then can the bonding process be carried out for all chips.

In this procedure however the electrically conductive connection between the chips and the substrate poses technical problems; this connection takes place recognizably by bumps or pins which extend from the chips to corresponding contacts in the substrate. Another technical problem is the choice of material properties of the underfill material since on the one hand it is intended to have an adhesive action (for tacking) and on the other hand a support function. Moreover the underfill material should have as little effect on the alignment accuracy as possible. At the same time the processing of the underfill material, especially during tacking and/or bonding, will take place as promptly as possible.

SUMMARY OF THE INVENTION

The object of this invention is therefore to devise a method for tacking of chips onto a substrate with high throughput and high alignment accuracy as well as improved electrical contact-making of the chips.

This object is achieved with the features of the independent claim(s). Advantageous developments of the invention are given in the dependent claims. All combinations of at least two of the features given in the specification, the claims and/or the figures also fall within the scope of the invention. At the given value ranges, values within the indicated limits will also be considered to be disclosed as boundary values and will be claimed in any combination.

The basic idea of this invention is to make the function layer at the chip positions, at least in the region of the contacts, such that there is a free space for contact elements for making electrical contact of the chips with the contacts of the substrate. This leads to a higher throughput and thus to an economical and/or technical advantage.

Chip positions are the areas on the surface of the substrate on which the chips are positioned with a distance parallel to the substrate surface. The electrical contact-making takes place via contact elements, especially bumps or pins. The contacts can have a structure which can equalize tolerances with respect to the distance between the chip and wafer. For example let a contact be mentioned which consists of a serial sequence of a metal and an alloy, the alloy having a lower melting point. Upon contact of the chip with the wafer via the contacts, at an operating temperature which is above the melting point of the alloy, the latter melts on so that better parallelism between chip and wafer can be produced. The just mentioned serial version of a contact can be located not only on the bottom of a chip, but also on the top of the corresponding wafer. The serial version is also conceivable on chip and wafer.

The aforementioned measures, in concert or individually, improve the electrical contact-making of the chips and increase the alignment accuracy at the same time since the function layer need not be penetrated by the contact elements. Moreover, the choice of available materials for the function layer is expanded since neither is a capillary action necessary to deliver the function layer between the chips and the substrate surface, nor is penetration of the function layer with the contact elements with the expenditure of a displacement force necessary. This is especially advantageous for applications which require a very short distance between the chips and the substrate surface, since for distances of 50 μm, especially <30 μm, for simultaneously large-area chips conventional methods based on capillary action no longer work. Generally an increase of the contact density of the pins or bumps is accompanied by a reduction of the distance between the chips and the substrate surface. The ratio of the distance between the bumps, the so-called contact pitch, to the height difference between the chip and substrate surface is between 3:1 and 1:2.

According to one advantageous embodiment of the invention it is provided that the function layer is treated with a solvent on the chip contact side, especially immediately before tacking, in order to induce an adhesion property which is necessary for tacking. In this measure the use of an adhesive material for the function layer can be omitted. The tacking takes place especially via a solvent which is applied to one contact side of the chips and/or to the function layer. In particular a very small amount of solvent is applied, preferably less than 1 ml per mm$^2$, more preferably less than 0.1 ml per mm$^2$, still more preferably less than 0.01 ml per mm$^2$, most preferably less than 0.001 ml per mm$^2$. Thus, the solvent can be applied either in a blanket manner to the function layer and/or to the contact side of each chip. Upon contact of the chip with the function layer, a tacking layer of the function layer on the chip contact side liquefies and the chips are tacked onto the function layer by at least partial evaporation of the solvent. The tacking layer is more or less converted back into the function layer.

Alternatively, according to one advantageous embodiment of the invention it is provided that the function layer on the chip contact side be provided with an adhesion layer, especially with a temporary adhesive. This version has the advantage that for the function layer exactly the desired physical and/or chemical properties can be chosen by material selection, while an adhesion layer is responsible solely for the tacking and accordingly can be optimally selected.

In a further alternative the adhesion layer can be applied to the chips, preferably only immediately before placement of the chips.

In another embodiment it is possible for the function layer to have a so-called B-stage property. Materials with B-stage properties can change from one state into another by temperature and/or UV light and/or other known chemical and/or physical processes. In this case, thus in particular a crosslinking of the polymer material of the function layer which is to take place only after placement would be intended. These B-stage properties are known to one skilled in that art mainly, but not solely, from the IC packaging domain.

It is conceivable for the thickness of the function layer prior to the bond process of the chip onto the wafer to be greater than the distance between the bottom of the chip and the top of the chip. This layer is then compressed and/or displaced accordingly by a compressive force. In this way it is preferably guaranteed that the volume between the chip and substrate is completely filled.

In the two aforementioned alternative embodiments it is provided that the solvent or the adhesion layer be completely evaporated, especially without residue, in the subsequent bonding process.

To the extent uncovering additionally comprises uncovering of the exposed area of the surface located outside the chip positions, influencing the alignment results by thermal expansion of the function layer is minimized. In particular, the exposed areas are made such that parts of the final packaging there, especially consisting of a molding compound, can adhere to the latter.

In a development of the invention it is provided that the uncovering additionally encompasses a formation of channels in the function layer. This on the one hand further minimizes influence by thermal expansion of the function layer and on the other hand any pressure fluctuations in the cavities of the function layer are equalized by the channels, especially when they run to the contacts or free space which has been produced by the uncovering as far as the exposed area or the vicinity.

The function layer consists of material which has a low elasticity, especially a modulus of elasticity greater than 10 kN per $mm^2$, preferably greater than 20 kN per $mm^2$. In this way alignment errors by movements of the function layer are largely avoided.

According to another advantageous embodiment, the uncovering of the contacts and/or the uncovering of the exposed area and/or of the channels takes place by photostructuring, especially the steps being the following, preferably the sequence being the following:
  exposure of the function layer with a corresponding mask,
  stripping (removal) of the areas to be uncovered.

According to another embodiment of the invention, it is advantageously provided that when the contacts are uncovered, through openings are formed in the function layer, which openings extend as far as the contacts and are arranged especially concentrically to the contacts, especially with a diameter $D_1$ greater than a diameter $D_2$ of the contact elements. This configuration largely minimizes stress on the edges of the through openings. This approach applies analogously to square or rectangular contacts.

A substrate with a function layer which has been applied to the surface of the substrate and which is uncovered at chip positions in the region of the substrate contacts, is disclosed as an independent invention, especially produced by a method which was described above.

In a development of the substrate, it is advantageously provided for the substrate to have chips which are tacked onto one chip contact side of the function layer at the chip positions and which are electrically connected via contact elements to the contacts of the substrate.

Other advantages, features and details of the invention will become apparent from the following description of preferred exemplary embodiments and using the drawings.

BRIEF DESCRIPTION OF THE INVENTION

Figure 1B:
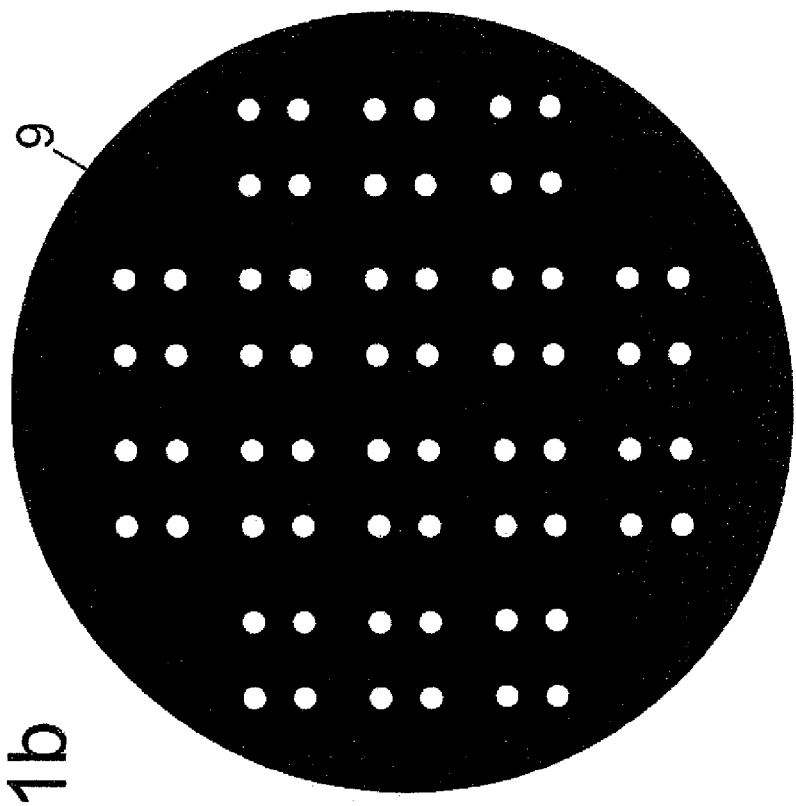
Figure 2B:
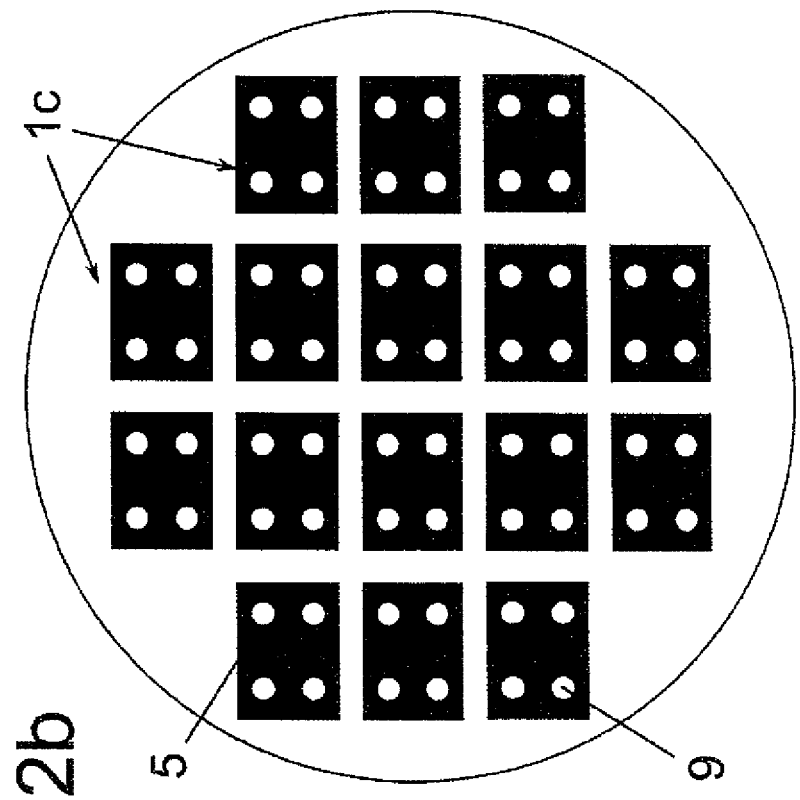
Figure 2A:
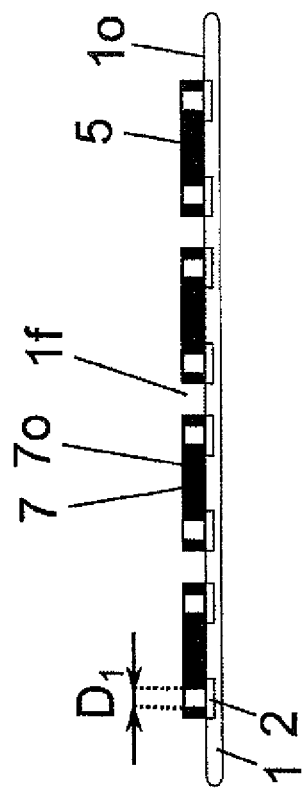
Figure 3A:
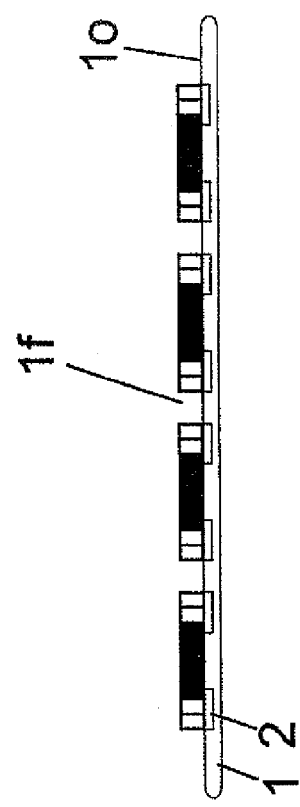
Figure 3B:
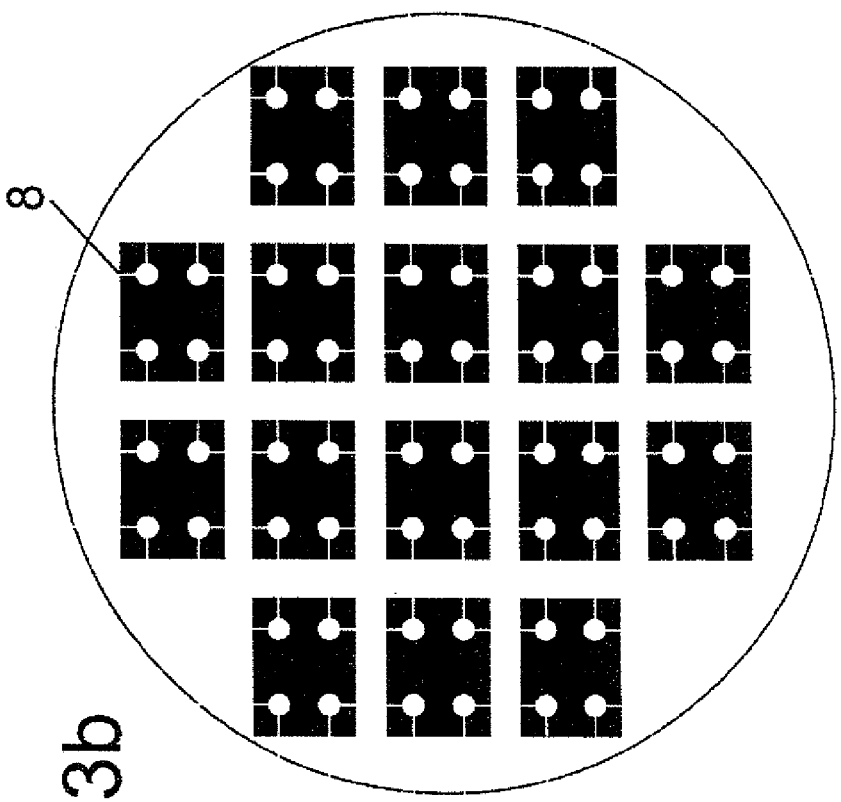
Figure 4A:
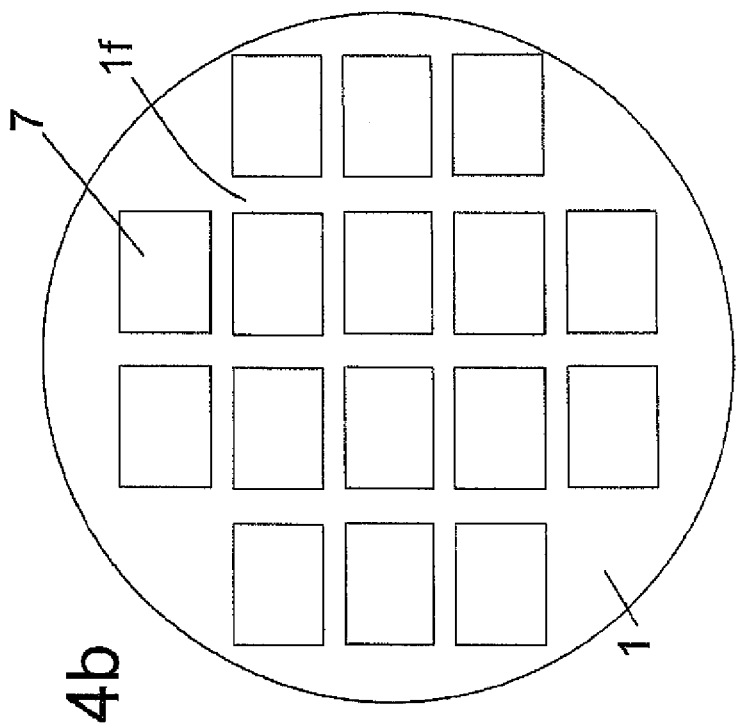
Figure 4B:
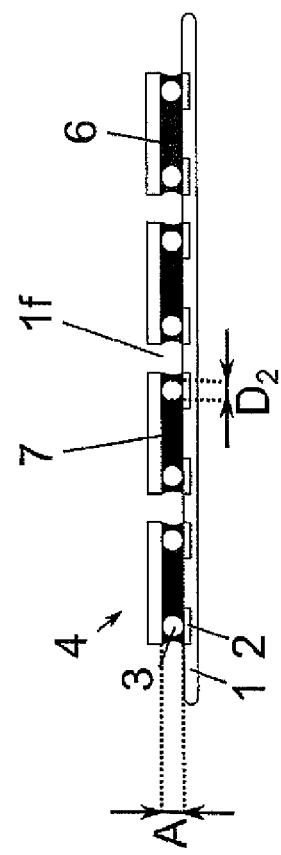

FIG. 1a shows a schematic cross sectional view of a substrate with an applied function layer, FIG. 1b shows a plan view of the function layer according to FIG. 1a, FIG. 2a shows a cross sectional view of the substrate according to FIG. 1a after a step of uncovering, FIG. 2b shows a plan view of the substrate according to FIG. 2a, FIG. 3a shows a cross sectional view of the substrate after a further step of uncovering of channels, FIG. 3b shows a plan view of the substrate according to FIG. 3a, FIG. 4a shows a cross sectional view of another method step of tacking of chips onto the function layer and FIG. 4b shows a plan view of the substrate according to FIG. 4a.

In the figures the same parts or parts with the same action are identified with the identical reference numbers.

DETAILED DESCRIPTION OF THE INVENTION

In the method step which is shown in FIGS. 1a and 1b, a function layer 7 with low elasticity (therefore provided with a high modulus of elasticity) is applied to a surface 10 of the substrate. Especially spin coating, spray coating, extrusion coating, lamination, gas precipitation or similar methods are used for application. The function layer 7 is used as underfill or support material for supporting the chips 4 which are tacked onto the substrate 1 by the method of the present invention.

The function layer 7 is applied over the entire surface and is already solid or rigid upon application or at least at the end of the application process or is transferred into a solid or rigid state by phase conversion or a polymerization step. A photo-structuring process uncovers (i.e., removes) the function layer 7 at the contact-making positions, at which there are contacts 2 on the surface 1o so that from one chip contact side 7o facing away from the surface 1o to the surface 1o a free space, especially in the form of through openings 9, is formed.

During the photostructuring process the function layer 7 is exposed, lithographically opened and stripped. The structuring and exposure must take place such that the corresponding contact sites are free after the development process. Accordingly for positive or negative materials the correct exposure steps and the correct exposure mask must be used.

In particular, the function layer 7 outside of chip positions 1c is uncovered (i.e., removed) in the same way, as a result of which one exposed area 1f is formed on the surface 1o. In one preferred embodiment this takes place in the same step as the production of the openings 9. Thus on the surface 1o there is a plurality (here: 16) of support elements 5, in particular uniformly distributed, which have been produced by the above-described uncovering (i.e., removal) of the function layer 7.

Each support element 5 in the illustrated exemplary embodiment has four through openings 9 on whose bottom 7u facing away from the chip contact side 7o there are contacts 2.

In particular with the above described structuring process channels 8 are formed in the function layer 7 and extend from the exposed area 1f to the through openings 9, especially two channels 8 at a time for each through opening 9. Thus each support element 5 has eight channels 8.

In the method step which is shown in FIGS. 4a and 4b, the chips 4 are tacked onto the support elements 5 by one contact side 4k being wetted with a solvent for contact-making of the support elements 5 on the chip contact side 7o of the function layer 7. The solvent liquefies a thin tacking layer 6 on the chip contact side 7o of the function layer 7 and provides for tacking of the chips 4 on the corresponding support elements 5. Tacking describes a nonpermanent, reversible connection which is sufficient to transport the substrate 1 provided with the chips 4 to a separate bond module without the chips 4 which are aligned exactly relative to the substrate 1 slipping until the formation of a permanent bond in the bond module.

The chips 4 are electrically connected to the contacts 2 of the substrate 1 via contact elements 3 (here: bumps). The through openings 9 have a diameter $D_1$ greater than the corresponding (therefore running parallel to the surface 1o), especially maximum diameter $D_2$ of the contact elements 3.

In one preferred embodiment the through openings 9 are made as a fit for the contact elements 3 with a play smaller than 5 μM.

Alternatively to the above described tacking by solvents, it is conceivable to provide a temporary cement, especially bibencyl, polyethylene glycol, or novomer on the chip contact side 7o in order to tack the chips 4 onto the support elements 5.

The material for the function layer 7 can be especially the following: polyamide, COC, SU-8, BCB. It is furthermore conceivable to use materials which were developed especially for this application. To the extent the function layer 7 is produced by curing, possible recovery methods are the following: heating, UV irradiation, application of a force, application of pressure, magnetic fields or microwaves.

Tacking on the edge, spot tacking or tacking on the entire contact surface between the chips 4 and the support elements 5 are possible for tacking.

The solvent is applied to the chips 4 and/or the support elements 5 especially by immersion, inkjetting, spin-coating or evaporation.

Pretreatment methods prior to tacking can be the following: plasma treatment, wet etching and/or $CO_2$ cleaning.

A distance A between the surface 1o and the chip contact side 4k is defined by the formation of the function layer 7.

REFERENCE NUMBER LIST 1 substrate
1o surface
1c chip positions
1f exposed area
2 contacts
3 contact elements
4 chips
4k contact side
5 support elements
6 tacking layer
7 function layer
7o chip contact side
7u bottom
8 channels
9 through openings
$D_1$ diameter
$D_2$ diameter
A distance Having described the invention, the following is claimed:

1. A method for tacking of chips onto a substrate at chip positions which are distributed on a surface of the substrate, said method comprising:
   forming or applying a function layer onto the surface of the substrate,
   after forming or applying the function layer onto the surface of the substrate, removing the function layer from the surface of the substrate at the chip positions at least in the region of contacts to uncover the contacts,
   tacking chips onto a chip contact side of the function layer at the chip positions and contacting the chips with the contacts via contact elements.

2. The method as claimed in claim 1, wherein the method further comprises:
   treating the function layer with a solvent on the chip contact side in order to induce an adhesion property which is necessary for tacking.

3. The method as claimed in claim 1, wherein the method further comprises:
   providing an adhesion layer onto the chip contact side of the function layer.

4. The method as claimed in claim 1, wherein the method further comprises:
   after forming or applying the function layer onto the surface of the substrate, removing the function layer from the surface of the substrate outside the chip positions, thereby providing an exposed area of the surface of the substrate outside of the chip positions.

5. The method as claimed in claim 1, wherein the step of removing the function layer from the surface of the substrate includes formation of channels in the function layer.

6. The method as claimed in claim 1, wherein the function layer is comprised of a material having low elasticity.

7. The method as claimed in claim 1, wherein the step of removing the function layer from the surface of the substrate to uncover the contacts takes place by photostructuring.

8. The method as claimed in claim 1, wherein
   the step of removing the function layer from the surface of the substrate to uncover the contacts includes forming through openings in the function layer when uncovering the contacts, said openings extending through the function layer to the contacts.

9. The method as claimed in claim 1, wherein the method further comprises:
   aligning the chips with the contacts before tacking.

10. The method as claimed in claim 1, wherein the method further comprises:
    permanently bonding the chips to the function layer after tacking.

11. The method as claimed in claim 2, wherein the function layer is treated with the solvent on the chip contact side immediately before tacking.

12. The method as claimed in claim 4, wherein the step of removing the function layer from the surface of the substrate outside the chip positions, thereby providing the exposed area, takes place by photostructuring.

13. The method as claimed in claim 12, wherein the photostructuring includes the following steps:
 exposure of the function layer on areas which are to be uncovered,
 lithography of the areas which are to be uncovered, and
 stripping of the areas which are to be uncovered.

14. The method as claimed in claim 5, wherein formation of the channels takes place by photostructuring.

15. The method as claimed in claim 14, wherein the photostructuring includes the following steps:
 exposure of the function layer on areas which are to be uncovered,
 lithography of the areas which are to be uncovered, and
 stripping of the areas which are to be uncovered.

16. The method as claimed in claim 5, wherein the channels are formed in the function layer beginning from the contacts.

17. The method as claimed in claim 5, wherein the channels are formed in the function layer ending on an exposed area of the surface of the substrate located outside of the chip positions.

18. The method as claimed in claim 7, wherein the photostructuring includes the following steps:
 exposure of the function layer on areas which are to be uncovered,
 lithography of the areas which are to be uncovered, and
 stripping of the areas which are to be uncovered.

19. The method as claimed in claim 8, wherein said openings are arranged concentrically to the contacts.

20. The method as claimed in claim 8, wherein said openings in the function layer have a diameter $D_1$ that is greater than a diameter $D_2$ of the contact elements.

21. A method for tacking of chips onto a substrate at chip positions which are distributed on a surface of the substrate, said method comprising:
 forming or applying a function layer onto the surface of the substrate;
 after forming or applying the function layer onto the surface of the substrate, removing the function layer from the surface of the substrate at the chip positions at least in the region of contacts to uncover the contacts; and
 tacking chips onto a chip contact side of the function layer at the chip positions and contacting the chips with the contacts via contact elements, wherein the ratio of (i) a distance between contact elements to (ii) a height difference between a lower surface of each chip and the surface of the substrate, is between 3:1 and 1:2.

\* \* \* \* \*